United States Patent
Thornell-Pers

(10) Patent No.: US 7,292,829 B2
(45) Date of Patent: Nov. 6, 2007

(54) POWER AMPLIFIER EFFICIENCY

(75) Inventor: Anders Thornell-Pers, Åkersberga (SE)

(73) Assignee: AMC Centurion AB, Akersberga (SE)

( * ) Notice: Subject to any disclaimer, the term of this patent is extended or adjusted under 35 U.S.C. 154(b) by 83 days.

(21) Appl. No.: 10/521,990

(22) PCT Filed: Oct. 10, 2003

(86) PCT No.: PCT/SE03/01582

§ 371 (c)(1),
(2), (4) Date: Jan. 19, 2005

(87) PCT Pub. No.: WO2004/034568

PCT Pub. Date: Apr. 22, 2004

(65) Prior Publication Data
US 2005/0239423 A1 Oct. 27, 2005

(30) Foreign Application Priority Data
Oct. 10, 2002 (SE) .................................. 0202989

(51) Int. Cl.
H04B 1/04 (2006.01)
H04B 17/00 (2006.01)
H03C 1/62 (2006.01)

(52) U.S. Cl. .................. 455/127.1; 455/115.1; 330/144

(58) Field of Classification Search ............ 455/127.1, 455/73, 127.2, 77, 127.3, 107, 127.4, 127.5, 455/115.3, 552, 115.1, 115.2, 114.3, 191.1, 455/193; 330/297, 298, 144, 129, 127; 343/876, 767
See application file for complete search history.

(56) References Cited

U.S. PATENT DOCUMENTS

| | | | |
|---|---|---|---|
| 6,061,025 A * | 5/2000 | Jackson et al. ............. 343/745 |
| 6,349,216 B1 | 2/2002 | Alberth et al. |
| 6,538,506 B2 * | 3/2003 | Hareyama .................... 330/129 |
| 6,549,169 B1 * | 4/2003 | Matsuyoshi et al. ......... 343/767 |
| 6,571,087 B1 * | 5/2003 | Iwatsuki .................. 455/127.1 |
| 6,678,506 B1 * | 1/2004 | Dolman et al. ........... 455/127.3 |
| 6,862,432 B1 * | 3/2005 | Kim ........................ 455/193.1 |
| 2002/0057222 A1 * | 5/2002 | McKinzie et al. .......... 343/909 |
| 2002/0183013 A1 * | 12/2002 | Auckland et al. ............. 455/73 |
| 2002/0193088 A1 * | 12/2002 | Jung ....................... 455/191.1 |
| 2003/0160728 A1 * | 8/2003 | Fukushima et al. ......... 343/767 |

FOREIGN PATENT DOCUMENTS

| | | |
|---|---|---|
| EP | 1 093 222 A1 | 4/2001 |
| EP | 1 156 582 A2 | 11/2001 |
| EP | 1 248 362 A1 | 10/2002 |

* cited by examiner

Primary Examiner—Quochien B. Vuong
(74) Attorney, Agent, or Firm—Holland & Hart LLP

(57) ABSTRACT

The present invention relates to a method and an arrangement for optimizing the efficiency of a power amplifier (1) that is utilized for transmission of radio signals in a portable radio communication device, such as a mobile phone. The impedance loading the power amplifier (1) is controlled by a controller (5) in dependence on a transmission power of the portable radio communication device, wherein the radiating impedance of an antenna element (2) loading the power amplifier is controlled in dependence of the desired load impedance. Preferably, the changing of radiating impedance is performed by changing a capacitive coupling between the antenna element and a ground element or by changing the size of the antenna element. Better efficiency and bandwidth are thereby attained.

24 Claims, 3 Drawing Sheets

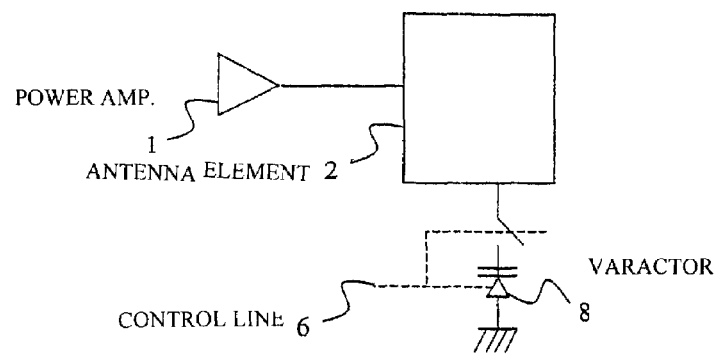
FIG. 4
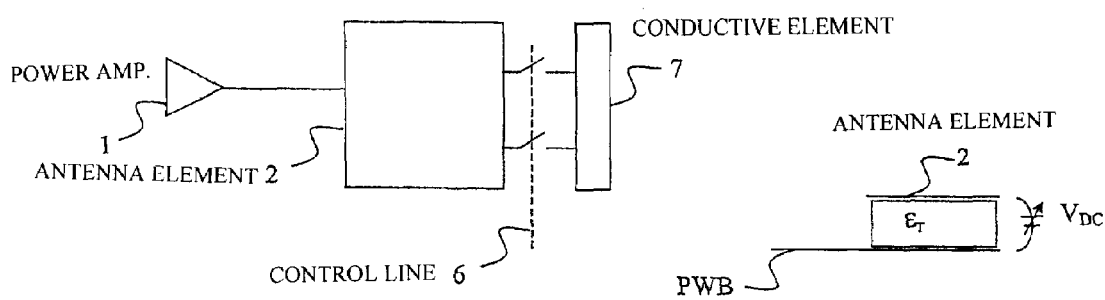
FIG. 5  FIG. 6
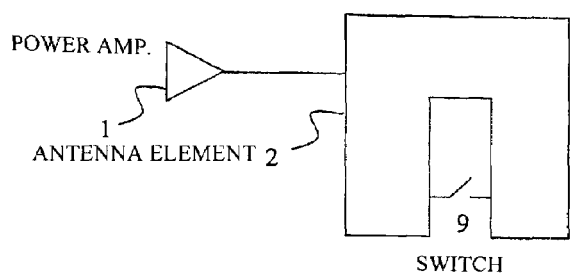
FIG. 7

POWER AMPLIFIER EFFICIENCY

FIELD OF INVENTION

The present invention generally relates to a power amplifier in a portable radio communication device. Particularly, the present invention relates to a method and an arrangement for optimizing the efficiency of a power amplifier in a portable radio communication device.

BACKGROUND

New mobile communication systems are continuously being developed and more and more functions tend to be integrated into the mobile phone terminals, causing increased power consumption in the terminals. It is difficult to improve the capacity of batteries because the size of the batteries is reduced together with the reduction of size of mobile phones. It is thus of great importance to find ways of reducing the power consumption in mobile phone terminals.

One of the more power consuming components in a mobile phone is the power amplifier in the radio transmitter. A reduction of the power consumption of the power amplifier would be a good contribution to the reduction of the power consumption of the mobile phone.

The output power from and the efficiency of a power amplifier (PA) are strongly affected by the input power to the PA and the impedance of components loading the PA. The optimal value of the impedance of the components loading the PA varies in dependence on the output power from the PA.

Figure 1:
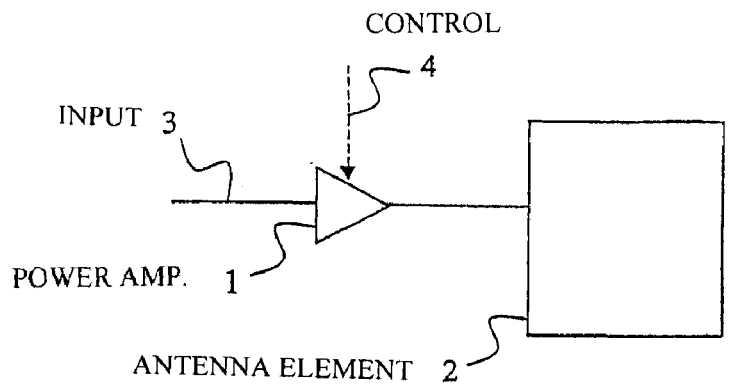

A prior art set up for a power amplifier in a mobile phone is schematically illustrated in FIG. 1. A transmission signal is fed to the input 3 of a power amplifier 1. A control signal 4 is fed to the power amplifier 1 to specify what output power the signal is to be amplified to. The amplified signal is then transmitted through an antenna element 2. There is often provided both filters and switches between the power amplifier and the antenna element (not illustrated). The combined components after the power amplifier constitute the impedance loading the power amplifier.

Traditionally the impedance loading the PA is chosen to optimize the PA for maximal power output from the PA. A PA outputting lower than maximal power will not work optimally efficient. However, this is ignored as the inefficient lower power output consumes less power than the efficient maximal power output.

In EP 1093222 assigned to Matsushita Electric Industrial Co, a variable load circuit is utilized to compensate for varying loads loading a power amplifier, thus to load the power amplifier with a constant load. The variable load circuit provided between the output of the power amplifier and the feeding portion of an antenna element introduces extra costs and is also bandwidth limiting.

In U.S. Pat. No. 5,673,287 assigned to Motorola, a dual mode amplifier network enables a radiotelephone to operate in two different transmission modes, one analog and one digital, with one power amplifier. This power amplifier is nevertheless only optimized for maximal transmission power, even if for two transmission modes.

SUMMARY OF THE INVENTION

An object of the present invention is to provide a method and an arrangement that reduce the power consumption of a portable radio communication device by improving the efficiency of the transmitting radio frequency (TX-RF) front end thereof.

Another object of the present invention is to avoid the problem of matching components in a portable radio communication device to the standard of 50 Ohms.

Yet another object is to provide an TX-RF front end having improved bandwidth as compared to prior art.

These objects, among others, are according to the present invention attained by methods and arrangements as defined in the appended claims.

By providing in a portable radio communication device, such as a mobile phone, an antenna element having a variable antenna radiating impedance, it is possible to provide a load loading the power amplifier so that the power amplifier operates as efficiently as possible for any desired transmission power output.

In a preferred embodiment, the radiating impedance of the antenna element is changed by changing a capacitive coupling between the antenna element and a ground element.

In another preferred embodiment, the radiating impedance of the antenna element is changed by changing the size of the antenna element.

Other preferred embodiments are defined in the dependent claims.

Further features and advantages of the present invention will be evident from the following description.

BRIEF DESCRIPTION OF TEE DRAWINGS

Figure 2:
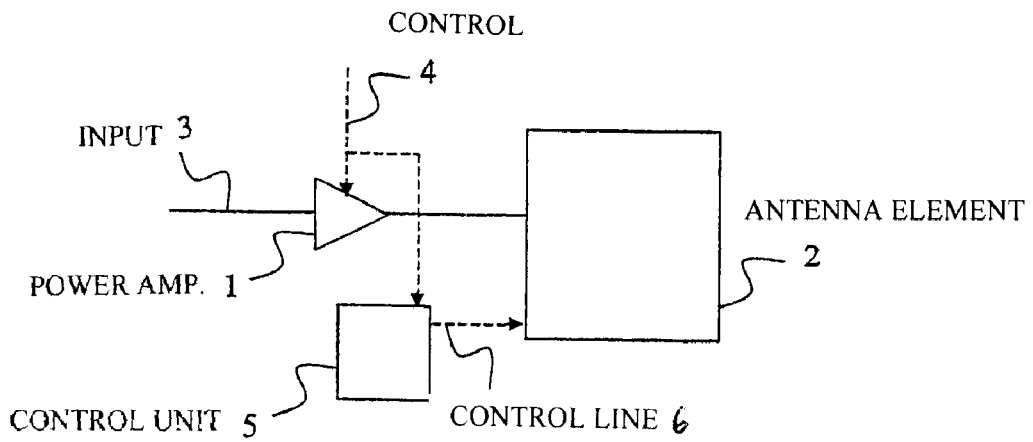
Figure 3:
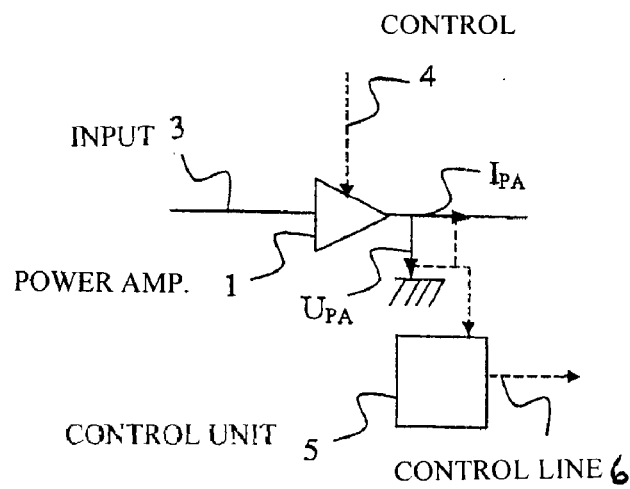

The present invention will become more fully understood from the detailed description of embodiments given below and the accompanying drawings, which are given by way of illustration only, and thus, are not limitative to the present invention, wherein:

FIG. 1 schematically illustrates a power amplifier connected to an antenna element according to prior art;

FIG. 2 schematically illustrates a first embodiment of the present invention;

FIG. 3 schematically illustrates a second embodiment of the present invention;

FIG. 4 schematically illustrates a first way of changing an impedance loading a power amplifier;

FIG. 5 schematically illustrates a second way of changing an impedance loading a power amplifier;

FIG. 6 schematically illustrates a third way of changing an impedance loading a power amplifier; and FIG. 7 schematically illustrates a fourth way of changing an impedance loading a power amplifier.

Figure 8:
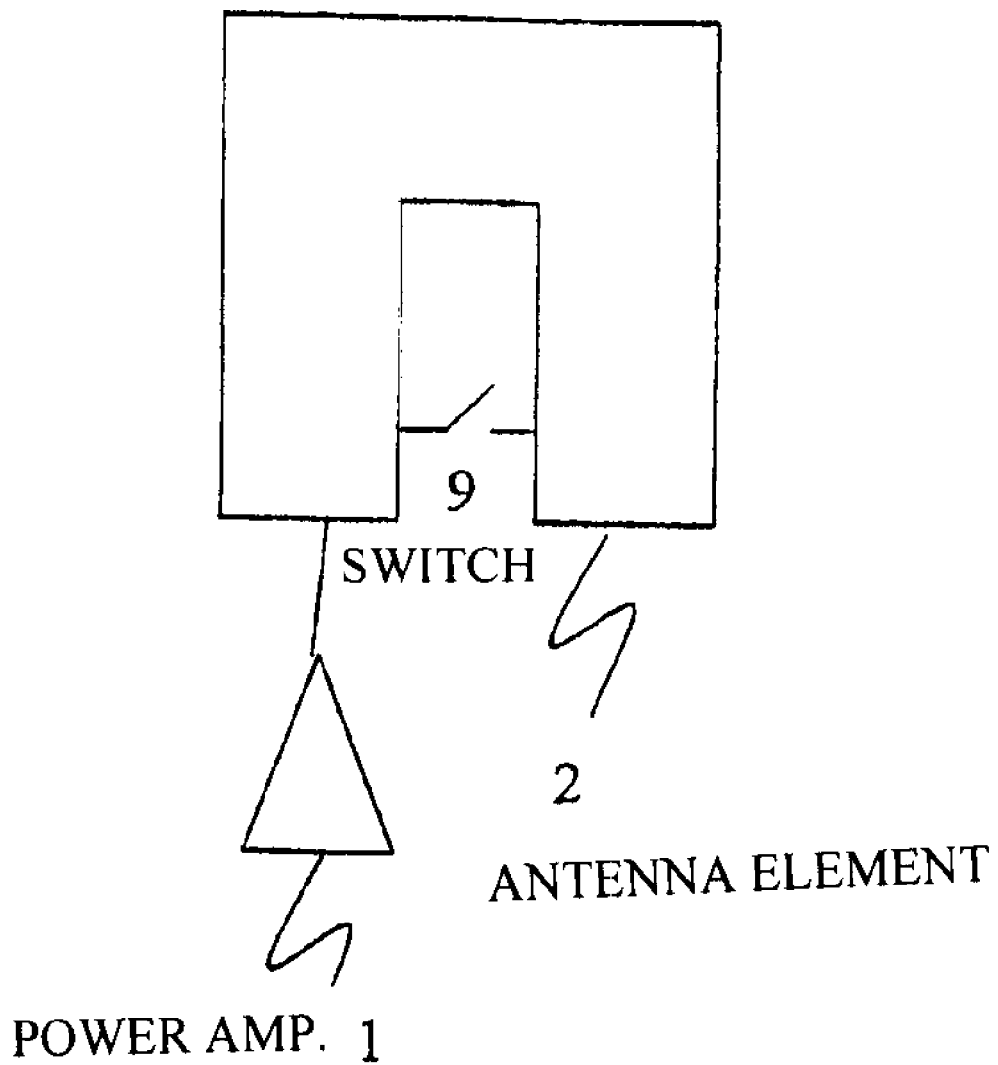

FIG. 8 schematically illustrates a fourth way of changing an impedance loading a power amplifier.

DETAILED DESCRIPTION OF EMBODIMENTS

In the following description, for purpose of explanation and not limitation, specific details are set forth, such as particular techniques and applications in order to provide a thorough understanding of the present invention. However, it will be apparent for a person skilled in the art that the present invention may be practiced in other embodiments that depart from these specific details. In other instances, detailed description of well-known methods and apparatuses are omitted so as not to obscure the description of the present invention with unnecessary details.

The prior art set up for a power amplifier in a mobile phone shown in FIG. 1 has already been described and will not be further dealt with herein.

A first embodiment of the present invention will now be described with reference to FIG. 2.

A portable radio communication device, such as a mobile phone, comprises a power amplifier (PA) 1, an antenna element 2, and a control unit 5. The PA 1 is utilized to amplify a transmission signal fed to an input 3 of the PA 1. The level of the output power from the PA 1 is determined by the input power or a signal 4 indicative of a desired transmission power from the mobile phone. The signal 4 may be a direct power class or an amount of decrease/increase. The desired power of output signal is typically continuously received from a base station indicating the necessary transmission power from the mobile phone.

The amplified transmission signal is fed to the antenna element 2 for the transmission of the signal to the base station. Between the PA 1 and the antenna element 2 there may be provided filters and switches (not illustrated) e.g. to obtain desired transmission frequencies, to obtain different types of diversity, to provide reception and transmission, and/or to remove undesired signals. There may also be provided more antenna elements.

The control unit 5 is arranged to continuously establish the desired transmission power of the mobile phone, by tapping the signal 4. The control unit 5 then determines the corresponding desired load impedance that gives an optimal efficiency of the power amplifier 1. This is attained by use of a look-up table comprising correspondences between output power and load impedance for the power amplifier 1. The look-up table may e.g. be obtained by trial and error. The look-up table may further contain different load impedances for one output power, in dependence on different working positions, such as in free space or in close proximity of a head of a user.

Next the control unit 5 controls the arrangement loading the power amplifier 1 in dependence of the desired load impedance. This is attained by controlling a capacitive coupling between the antenna element 2 and ground, as illustrated in FIG. 4. The capacitance of a varactor 8, connected to a ground element, is changed in dependence of the desired load impedance and/or is connected to and disconnected from the antenna element 2. The varactor is controlled by the control unit via a control line 6 from the control unit 5. It is naturally possible to replace or supplement the varactor with one or more capacitors (not illustrated).

An important feature of the present invention is thus that there are no circuits provided between the output of the power amplifier and the feeding portion of the antenna element that are used for adjusting the load of the power amplifier. Instead, it is the antenna radiating impedance itself that is used to adjust the load impedance. This gives several advantages as compared to prior art. Firstly, the total efficiency of the TX-RF front end is improved. By TX-RF front end is meant the power amplifier, possible filters and antenna element taken together. Secondly, it removes the problem of matching the antenna to the conventional 50 Ohms. Instead, the antenna radiating impedance is adjusted to the operating conditions. Thirdly, the bandwidth of the TX-RF front end is improved as the prior art variable load circuit that is bandwidth limiting is dispensed with.

Systems that require a high linearity of the PA have to accept lower efficiency in the PA to achieve that higher linearity and the benefit of increased efficiency is thus even greater in such systems. E.g., new systems that require higher bit rates than older systems require PA with higher linearity.

Next, a second embodiment of the present invention will be described with reference to FIG. 3. This second embodiment is identical to the first embodiment except for the following.

The control unit 5 establishes the desired transmission power of the mobile phone by measuring the current $I_{PA}$ output from the PA 1 and the voltage $V_{PA}$ output from the PA 1. This way of establishing the desired transmission power may alternatively be in addition to the tapping of the signal 4 described in the first embodiment (not illustrated).

An alternative way of controlling the impedance of the antenna element loading the PA 1 is to change the size of the antenna element 2, as illustrated in FIG. 5. One way of changing the size of the antenna element 2 is to connect an electrically conductive element 7 to the antenna element 2 or to disconnect the conductive element 7 from the antenna element 2.

If the antenna element is provided on a dielectric body, as illustrated in FIG. 6, a further way of controlling the impedance of the antenna element loading the PA 1 is to adjust the dielectric factor $\epsilon_r$ of the dielectric body. This adjustment of the dielectric factor may be obtained by applying a control voltage over the dielectric body.

A yet further way of controlling the impedance of the antenna element is to provide a switch 9 across a slit in the antenna element, as shown in FIG. 7. By opening and closing the switch, the effective length of the slit is adjusted and therewith the radiating impedance of the antenna element.

A still further way of controlling the impedance of the antenna element is to provide a switch 9 across a slit in the antenna element, as shown in FIG. 8. By opening and closing the switch, the effective length of the slit is adjusted and therewith the radiating impedance of the antenna element. The adjustable slit is located between signal and ground.

A third embodiment of the present invention will next be described.

A portable radio communication device, such as a mobile phone, comprises a power amplifier (PA), an antenna element, and a control unit. The PA is utilized to amplify a transmission signal fed to an input of the PA. The level of the output power from the PA is determined by the input power and the amplification of the PA.

The amplified transmission signal is fed to the antenna element for the transmission of the signal to a base station. Between the PA and the antenna element there may be provided filters and switches (not illustrated) e.g. to obtain desired transmission frequencies, to obtain different types of diversity, to provide reception and transmission, and/or to remove undesired signals. There may also be provided more antenna elements.

The control unit is arranged to continuously determine the power output from the PA. This may be attained by measuring the current and voltage output from the PA. The control unit then adaptively controls the arrangement loading the power amplifier, including the antenna element, in dependence of the power output to increase that power output. Different ways to change the impedance of the arrangement loading the PA are described in connection with the first and second embodiments of the present invention.

This third embodiment may be combined with the first or second embodiment by adaptively controlling the arrangement loading the PA after the desired load impedance have been utilized to control the arrangement loading the PA.

It will be obvious that the present invention may be varied in a plurality of ways. Such variations are not to be regarded as departure from the scope of the present invention. All such variations as would be obvious for a person skilled in the art are intended to be included within the scope of the present invention.

One way of varying the present invention is to combine one way of changing the impedance loading the PA with another way of changing the impedance loading the PA, or with several other ways of changing the impedance loading the PA. As an example, an antenna device having one or more connectable/disconnectable elements as shown in FIG. 5 can be provided on a dielectric substrate having an adjustable dielectric factor as shown in FIG. 6.

The invention claimed is:

1. A method for improvement of the efficiency of a power amplifier utilized for transmission of radio signals in a portable radio communication device, comprising the steps of:
   establishing a required transmission power of said portable radio communication device;
   determining a desired load impedance that gives an optimal efficiency of said power amplifier for said required transmission power; and
   controlling the radiating impedance of an antenna element loading said power amplifier in dependence of said desired load impedance, without use of a matching circuit between the power amplifier and the antenna element.

2. The method as claimed in claim 1, wherein said step of controlling is followed by a step of adaptively controlling said arrangement in dependence of a power output from said power amplifier to increase said power output.

3. The method as claimed in claim 1, wherein said step of establishing comprises reading out a control signal fed to said power amplifier or reading out the required output power defined by a base station.

4. The method as claimed in claim 1, wherein said step of establishing comprises measuring an output voltage and an output current from said power amplifier.

5. The method as claimed in claim 1, wherein said step of determining a desired load impedance comprises retrieving said desired load impedance corresponding to said required transmission power from a look-up table.

6. A method for improvement of the efficiency of a power amplifier utilized for transmission of radio signals in a portable radio communication device, comprising the steps of:
   determining a power output from said power amplifier; and
   controlling the radiating impedance of an antenna element loading said power amplifier adaptively in dependence of said power output from said power amplifier to increase said power output, without use of a matching circuit between the power amplifier and the antenna element.

7. The method as claimed in claim 6, wherein said step of controlling comprises changing a capacitive coupling between said antenna element and a ground element.

8. The method as claimed in claim 7, wherein said capacitive coupling is changed by varying the capacitance of a varactor.

9. The method as claimed in claim 7, wherein said capacitive coupling is changed by connecting or disconnecting a capacitance.

10. The method as claimed in claim 6, wherein said step of controlling comprises changing the size of said antenna element.

11. The method as claimed in claim 10, wherein said size is changed by connecting a conductive element to said antenna element or disconnecting the conductive element from said antenna element.

12. The method as claimed in claim 6, wherein said step of controlling comprises adjusting comprises adjusting the length of a slit of said antenna element.

13. The method as claimed in claim 6, wherein said antenna element is provided on a dielectric body and said step of controlling comprises changing the dielectric factor ($\epsilon_r$) of said dielectric body.

14. The method as claimed in claim 13, wherein said dielectric factor is changed by applying a control voltage over said dielectric body.

15. An arrangement for improvement of the efficiency of a power amplifier utilized for transmission of radio signals in a portable radio communication device, comprising:
   a means for establishing a required transmission power of the portable radio communication device;
   a means for determining a desired load impedance that gives an optimal efficiency of said power amplifier for said required transmission power;
   an antenna element connected to an output of said power amplifier; and
   a control unit for controlling the radiating impedance of the antenna element loading said power amplifier in dependence of said desired load impedance, without use of a matching circuit between the power amplifier and the antenna element.

16. The arrangement as claimed in claim 15, wherein said means for establishing a required transmission power comprises a read out device for reading out a power control signal fed to said power amplifier or a read out device for reading out the required output power defined by a base station.

17. The arrangement as claimed in claim 15, wherein said means for establishing a required transmission power comprises a measure device for measuring an output voltage and an output current from said power amplifier.

18. The arrangement as claimed in claim 15, wherein said means for determining a desired load impedance comprises a look-up table containing correspondence between desired load impedance and required transmission power.

19. The arrangement as claimed in claim 15, wherein said device comprises a capacitive element connected to a ground element, wherein said control unit is arranged to control a coupling of said capacitive element to said antenna element.

20. The arrangement as claimed in claim 19, wherein said capacitive element is a varactor.

21. The arrangement as claimed in claim 15, comprising a conductive element, wherein said control unit is arranged to connect said conductive element to said antenna element or disconnect said conductive element from said antenna element.

22. The arrangement as claimed in claim 15, wherein said antenna element is provided on a dielectric body and said control unit is arranged to vary the dielectric factor ($\epsilon_r$) of said dielectric body.

23. The arrangement as claimed in claim 15, comprising a switch arranged to adjust the length of a slit in said antenna element.

24. An arrangement for improvement of the efficiency of a power amplifier utilized for transmission of radio signals in a portable radio communication device, comprising:
   a means for determining a power output from said power amplifier;

an antenna element connected to an output of said power amplifier; and a control unit for controlling the radiating impedance of the antenna element loading said power amplifier in dependence of said power output from said power amplifier to increase said power output, without use of a matching circuit between the power amplifier and the antenna element.

* * * * *